(12) United States Patent
Sher

(10) Patent No.: US 6,417,721 B2
(45) Date of Patent: *Jul. 9, 2002

(54) DEVICE AND METHOD FOR LIMITING THE EXTENT TO WHICH CIRCUITS IN INTEGRATED CIRCUIT DICE ELECTRICALLY LOAD BOND PADS AND OTHER CIRCUIT NODES IN THE DICE

(75) Inventor: Joseph C. Sher, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/878,576

(22) Filed: Jun. 11, 2001

Related U.S. Application Data (63) Continuation of application No. 09/136,592, filed on Aug. 19, 1998, which is a continuation of application No. 08/711,127, filed on Sep. 9, 1996, now Pat. No. 5,905,401.

(51) Int. Cl.$^7$ .................... H01H 37/76; H01H 85/00
(52) U.S. Cl. .................... 327/525; 327/407
(58) Field of Search .................... 327/407–413, 327/415–417, 525, 526; 365/230.02, 225.7

(56) References Cited

U.S. PATENT DOCUMENTS

| | | | |
|---|---|---|---|
| 3,885,167 A | * 5/1975 | Berglund | 257/241 |
| 4,813,041 A | 3/1989 | Reyneri | |
| 4,894,791 A | 1/1990 | Jiang et al. | |
| 5,233,233 A | 8/1993 | Inoue et al. | |
| 5,252,853 A | 10/1993 | Michii | |
| 5,327,018 A | 7/1994 | Karlish et al. | |
| 5,796,746 A | 8/1998 | Farnworth et al. | |
| 5,845,221 A | * 12/1998 | Hosokawa et al. | 307/10.1 |
| 5,877,992 A | 3/1999 | Wu et al. | |
| 5,889,713 A | 3/1999 | Chan et al. | |
| 5,892,726 A | 4/1999 | Moon et al. | |
| 5,926,034 A | 7/1999 | Seyyedy | |
| 5,986,956 A | 11/1999 | You | |

FOREIGN PATENT DOCUMENTS

JP    5-267464    10/1993

OTHER PUBLICATIONS

IBM Technical Disclosure Bulletin, "Multiple Mode Selector for Input/Output Circuitry", vol. 37, No. 7, Jul. 1994.
4 MEG DRAM DIE, Micron Technology, Inc., Nov. 1996, pp. 1–4.

* cited by examiner

Primary Examiner—Terry D. Cunningham
Assistant Examiner—Quan Tra
(74) Attorney, Agent, or Firm—TraskBritt (57) ABSTRACT

An inventive integrated circuit die includes a bond pad connected to first and second input buffers in the die through laser fuses. In one operating configuration of the die, the die uses the first input buffer but does not use the second input buffer, so the laser fuse between the bond pad and the second input buffer is blown. In another operating configuration of the die, the die uses the second input buffer but does not use the first input buffer, so the laser fuse between the bond pad and the first input buffer is blown. As a result, the capacitive load on the bond pad is similar to the capacitive load on similar bond pads in the die connected to only one input buffer in the die. Thus, signals propagate into all the bond pads at about the same improved speed.

31 Claims, 4 Drawing Sheets

DEVICE AND METHOD FOR LIMITING THE EXTENT TO WHICH CIRCUITS IN INTEGRATED CIRCUIT DICE ELECTRICALLY LOAD BOND PADS AND OTHER CIRCUIT NODES IN THE DICE

CROSS-REFERENCE TO RELATED APPLICATION

This application is a continuation of application Ser. No. 09/136,592, filed Aug. 19, 1998, pending, which is a continuation of application Ser. No. 08/711,127, filed Sep. 9, 1996, now U.S. Pat. No. 5,905,401, issued May 18, 1999.

BACKGROUND

1. Field of the Invention

The present invention relates in general to integrated circuit dice and, in particular, to devices and methods for limiting the extent to which circuits in integrated circuit dice load bond pads and other circuit nodes in the dice.

2. State of the Art

Integrated circuit (IC) dice or "chips" are small, generally rectangular electronic devices cut from a semiconductor wafer, such as a silicon wafer, on which multiple ICs have been fabricated. IC dice generally communicate with external circuitry, such as other IC dice, through wire, or tape-automated-bonding (TAB), leads connecting bond pads on the dice to the external circuitry, as shown in U.S. Pat. Nos. 5,252,853 and 5,272,590.

In most IC dice, including Dynamic Random Access Memory (DRAM) IC dice, it is preferable that electronic signals between external circuitry and circuitry on the dice propagate into or out of the dice through the bond pads as quickly as possible. For example, in DRAM IC dice it is preferable that address signals propagate into the dice through the bond pads as quickly as possible, because time spent waiting for the address signals to propagate into the dice slows the response time of the dice to read and write requests.

It is recognized that, in some IC dice, including some DRAM IC dice, there are anomalous differences in the time it takes electronic signals to propagate into or out of similar bond pads on the dice. For example, in the D37M DRAM IC die manufactured by the Assignee of the present invention, Micron Technology, Inc. of Boise, Id. address signals take 1 ns longer to propagate into one address bit bond pad (A9) than any other address bit bond pad. As a result, the response time of the D37M DRAM IC die is slowed by at least 1 ns.

Since it is preferable for electronic signals to propagate into and out of IC dice as quickly as possible, there is a need in the art for a recognition of the reason for the anomalous differences in propagation time described above. There is also a need for a device and method for reducing these anomalous differences in IC dice.

SUMMARY OF THE INVENTION

The present invention recognizes that anomalous differences in the time it takes electronic signals to propagate into or out of similar bond pads on some integrated circuit (IC) dice are caused by extra circuitry in the IC dice electrically loading some of the similar bond pads but not others. For example, some IC dice include different input buffers connected to the same bond pad, and in different configurations of the IC dice, some of the input buffers are used and others are not. Since all the different input buffers electrically load their bond pad with capacitance whether they are used or not, their bond pad is loaded with more capacitance than a bond pad connected to a single input buffer, and, as a result, it takes longer for electronic signals to propagate through their bond pad than through the bond pad connected to the single input buffer.

An inventive device for reducing these anomalous differences in propagation time includes a plurality of programmable circuits, each including, for example, programmable elements such as fuses or anti-fuses. Each programmable circuit is coupled to an external communication terminal (e.g., a bond pad) of an IC die and to one of many load circuits (e.g., input buffers) in the die. The programmable circuits are configurable to load the terminal with one or more of the load circuits and to isolate the terminal from the rest of the load circuits. As a result, the programmable circuits can be configured to load the terminal with only those load circuits needed for a particular configuration of the die, and the total electrical load on the terminal is reduced. When the electrical load is capacitive, the reduced load on the terminal allows signals to propagate more quickly through the terminal and into or out of the die.

In another embodiment of the present invention, an IC die includes the inventive device described above along with the terminal and the load circuits described above. Still another embodiment includes the IC die described above with the programmable circuits configured to load the terminal with one or more of the load circuits and to isolate the terminal from the rest of the load circuits. In a further embodiment, a semiconductor wafer includes an integrated circuit having the terminal, load circuits, and programmable circuits described above. In an additional embodiment, an electronic system includes an input device, an output device, a memory device, and a processor device, and one of these devices includes the IC die described above.

In still another embodiment, an IC die includes a first load circuit communicating through a bond pad on the die with external circuitry in a first operating mode of the die. A second load circuit communicates through the bond pad with external circuitry in a second operating mode of the die. A first fuse interposed between the bond pad and the first load circuit couples the bond pad to the first load circuit in the first operating mode and programmably isolates the bond pad from the first load circuit in the second operating mode. Also, a second fuse interposed between the bond pad and the second load circuit couples the bond pad to the second load circuit in the second operating mode and programmably isolates the bond pad from the second load circuit in the first operating mode.

In a still further embodiment, a limiting apparatus limits the extent to which first and second load circuits in an IC die associated with first and second modes of the die electrically load a circuit node in the die. The apparatus includes first and second programmable circuits coupled to the circuit node and the first and second load circuits. The programmable circuits are configurable in the first mode to load the circuit node with the first load circuit and to isolate the circuit node from the second load circuit. Also, the programmable circuits are configurable in the second mode to load the circuit node with the second load circuit and to isolate the circuit node from the first load circuit.

In still another embodiment, an IC die includes the limiting apparatus, load circuits, and circuit node described above, and the programmable circuits are configured in the first mode to load the circuit node with the first load circuit and to isolate the circuit node from the second load circuit.

DETAILED DESCRIPTION OF THE PREFERRED EMBODIMENT

The present invention recognizes that anomalous differences in the time it takes electronic signals to propagate into or out of similar bond pads on some integrated circuit (IC) dice are caused by extra circuitry in the IC dice electrically loading some of the similar bond pads but not others.

For example, the D37M Dynamic Random Access Memory (DRAM) IC die manufactured by the Assignee of the present invention, Micron Technology, Inc. of Boise, Id. includes a bond pad that operates as an Output Enable (OE) bond pad in a 1 Megabit×4 configuration of the die and as an address bit (A9) bond pad in a 4 Megabit×1 configuration of the die. Thus, by necessity both an OE input buffer in the die and an A9 input buffer in the die are connected to the OE/A9 bond pad, while only one of these input buffers is used in either configuration of the die. As a result, in either configuration, the OE/A9 bond pad is electrically loaded with the capacitance of both input buffers. Since most of the other address bit bond pads on the die are electrically loaded with the capacitance of only one input buffer, the OE/A9 bond pad is loaded with excessive capacitance. Because this excessive capacitance on the OE/A9 bond pad takes longer to charge than the lower capacitance associated with the other address bit bond pads, signals propagating into the die through the OE/A9 bond pad take longer to propagate in than signals propagating into the die through the other address bit bond pads.

Therefore, there is a need for an inventive IC die capable of isolating one of its bond pads from extra circuitry connected to the bond pad that is unnecessary for operation of the IC die in a selected configuration.

Figure 1:
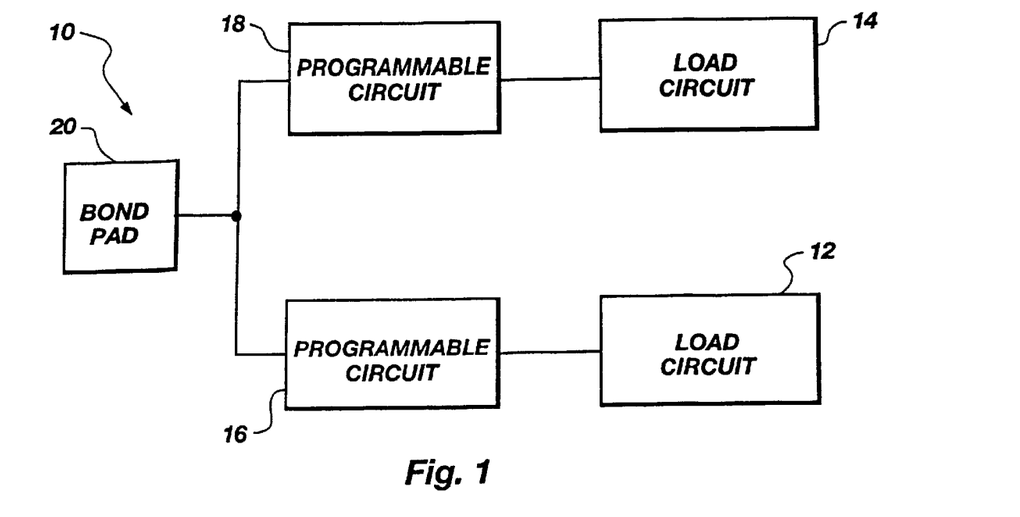
FIG. 1 is a block diagram of a portion of an integrated circuit die in accordance with the present invention.

As shown in FIG. 1, such an inventive IC die 10 includes load circuits 12 and 14 capable of communicating with external circuitry (not shown) through programmable circuits 16 and 18 and a terminal in the IC die 10, such as a bond pad 20. It will be understood by those having skill in the field of this invention that the IC die 10 may be any die, including, for example, a DRAM, Static Random Access Memory (SRAM), Synchronous Graphics Random Access Memory (SGRAM), and processor die. Also, although the IC die 10 is shown in FIG. 1 as having only two load circuits 12 and 14 and two programmable circuits 16 and 18, it will be understood that the present invention includes within its scope any number of load circuits and any number of programmable circuits. The programmable circuits 16 and 18 configurable by being programmable with an energy source selected from a group comprising a laser and a current source.

As will be described in more detail below with respect to FIGS. 4A and 4B, the load circuits 12 and 14 may be any circuitry that electrically loads (i.e., applies an impedance to) a circuit node such as the bond pad 20, including, for example, input and output buffers. Further, as will be described in more detail below with respect to FIGS. 2A–2F and 3A–3B, the programmable circuits 16 and 18 may comprise any circuitry configurable to connect or isolate separate conductors, including, for example, metal fuses, polysilicon fuses, anti-fuses, and switchable elements such as MOS transistors and multiplexers (e.g., CMOS multiplexers).

As used herein, "configurable" circuitry means circuitry that can connect separate conductors as the result of an affirmative act (e.g., an anti-fuse), and circuitry that connects separate conductors in the absence of an affirmative act (e.g., a fuse), and circuitry that isolates separate conductors in the absence of an affirmative act (e.g., an anti-fuse), and circuitry that can isolate separate conductors as the result of an affirmative act (e.g., a fuse). Thus, "configuring" as used herein can be an affirmative act with respect to a programmable circuit and it can be the absence of an affirmative act with respect to a programmable circuit. Also, "configured" as used herein can be the result of an affirmative act with respect to a programmable circuit and it can be the result of the absence of an affirmative act with respect to a programmable circuit.

If, for example, the load circuit 12 is unnecessary for operation of the IC die 10 (e.g., because the IC die 10 is in a configuration that does not require the load circuit 12), the programmable circuit 16 is configured to isolate the unnecessary load circuit 12 from the bond pad 20 at the same time the programmable circuit 18 is configured to connect the load circuit 14 to the bond pad 20. Conversely, if, for example, the load circuit 14 is unnecessary for operation of the IC die 10 (e.g., because the IC die 10 is in a configuration that does not require the load circuit 14), the programmable circuit 18 is configured to isolate the unnecessary load circuit 14 from the bond pad 20 at the same time the programmable circuit 16 is configured to connect the load circuit 12 to the bond pad 20. In either case, the electrical load on the bond pad 20 is reduced and, if the electrical load is a capacitive load, signals propagate through the bond pad 20 more quickly.

Thus, the IC die 10 is capable of isolating one of its bond pads or other circuit nodes from extra circuitry connected to the bond pad or other circuit node that is unnecessary for operation of the IC die 10 in a selected configuration.

Different versions of the programmable circuit 18 of FIG. 1 are shown in FIGS. 2A–2F. Of course, it will be understood that FIGS. 2A–2F are also representative of different versions of the programmable circuit 16 of FIG. 1.

Figure 2A:
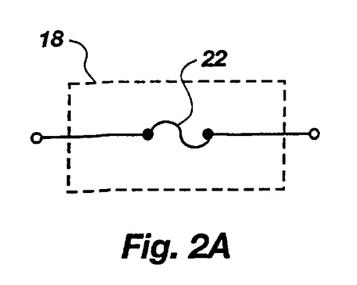
FIGS. 2A, 2B, 2C, 2D, 2E, and 2F are schematics of alternative versions of a programmable circuit in the integrated circuit die of FIG. 1.
Figure 2B:
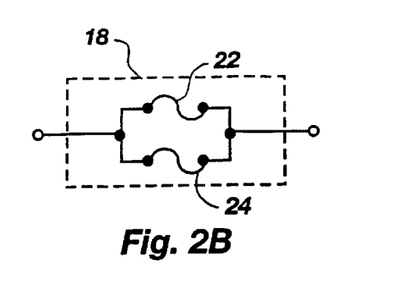

As shown in FIG. 2A, the programmable circuit 18 comprises a fuse 22, such as, for example, a metal or polysilicon fuse. The fuse 22 is preferably a relatively wide fuse in order to reduce its resistance. Also, the fuse 22 may be configured using a variety of well-known procedures, including, for example, destruction by laser or an electric current. As shown in FIG. 2B, the fuse 22 is provided in parallel with an additional fuse 24 in order to further reduce the overall resistance of the programmable circuit 18. Of course, although only two fuses 22 and 24 are shown in parallel in FIG. 2B, the present invention works with any number of fuses in parallel.

Figure 2C:
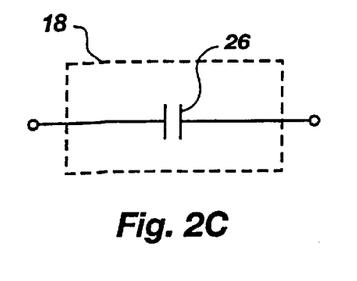
Figure 2D:
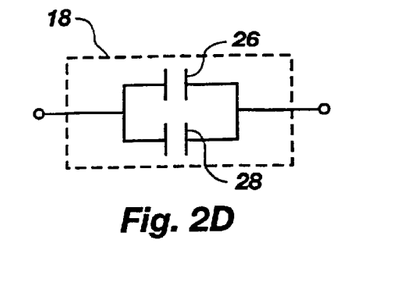

As shown in FIG. 2C, the programmable circuit 18 comprises an anti-fuse 26, typically configured or "programmed" in a well-known manner using a programming voltage. Also, as shown in FIG. 2D, the anti-fuse 26 is provided in parallel with an additional anti-fuse 28 in order to reduce the overall resistance of the programmable circuit 18 if the anti-fuses 26 and 28 are programmed or "blown." Of course, although only two anti-fuses 26 and 28 are shown in parallel in FIG. 2D, the present invention works with any number of anti-fuses in parallel.

Figure 2E:
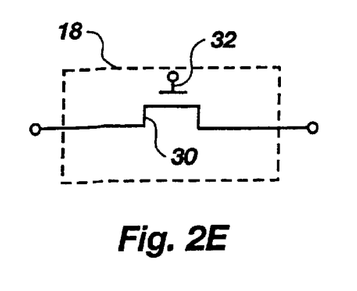
Figure 2F:
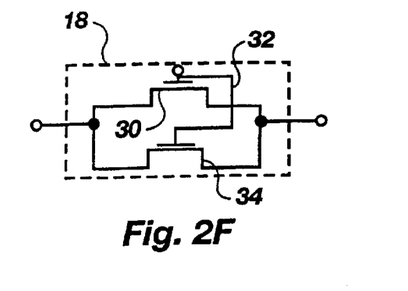
Figure 3A:
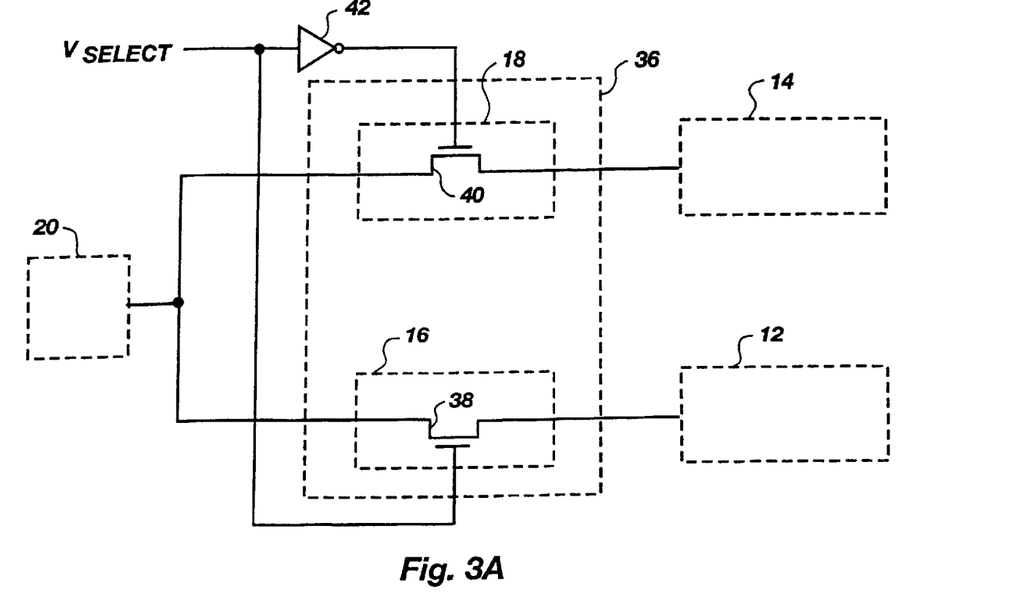
FIGS. 3A and 3B include schematics of alternative versions of programmable circuits in the integrated circuit die of FIG. 1.
Figure 3B:
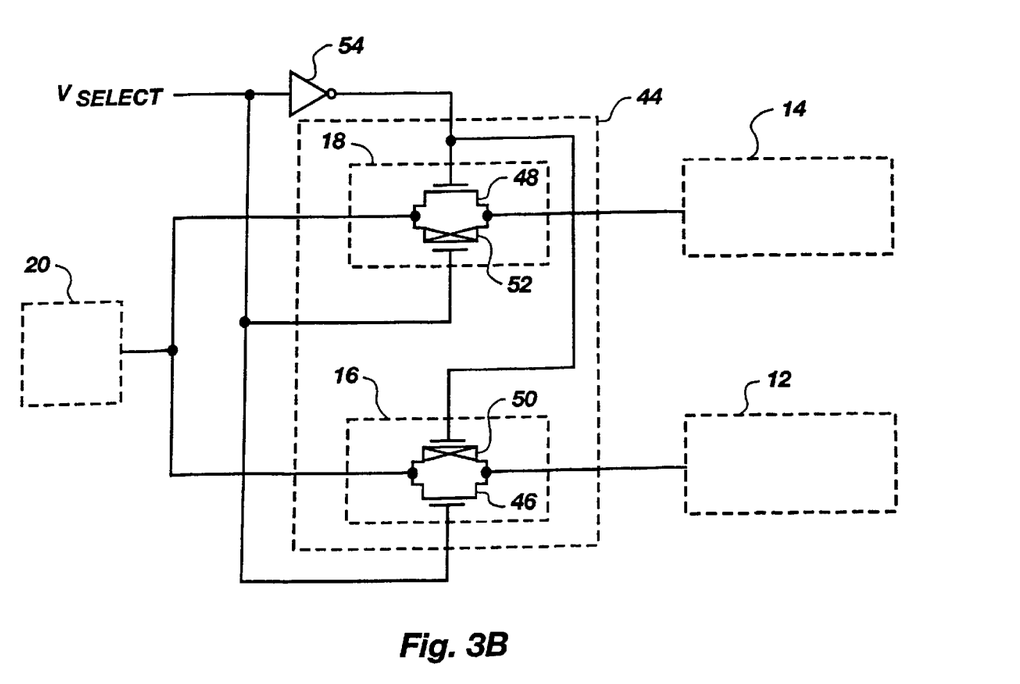

As shown in FIG. 2E, the programmable circuit 18 comprises a switchable element, such as a MOS transistor 30, typically configured by applying a control voltage (e.g., a supply or reference voltage) to its control terminal 32 using control circuitry (FIGS. 3A and 3B). Preferably, the MOS transistor 30 is a relatively large transistor in order to reduce its resistance. Also, as shown in FIG. 2F, the MOS transistor 30 is provided in parallel with an additional MOS transistor 34 in order to further reduce the overall resistance of the programmable circuit 18. Of course, although only two MOS transistors 30 and 34 are shown in parallel in FIG. 2F, the present invention works with any number of MOS transistors in parallel.

Of course, it will be understood that the programmable circuit 18 may comprise any one of the versions depicted in FIGS. 2A–2F, or any combination of those versions. Also, it will be understood that the fuses 22 and 24 and anti-fuses 26 and 28 of FIGS. 2A–2D may work in conjunction with other circuitry to implement the teachings of the present invention without being directly interposed between a load circuit and a bond pad or other circuit node.

As shown in FIG. 3A, the programmable circuits 16 and 18 together comprise an NMOS multiplexer 36 having NMOS transistors 38 and 40 that are selectable with a high control voltage $V_{SELECT}$ and control circuitry, such as an inverter 42, to couple the load circuit 12 to the bond pad 20 and to de-couple the load circuit 14 from the bond pad 20. The NMOS transistors 38 and 40 are also selectable with a low control voltage $V_{SELECT}$ and the inverter 42 to couple the load circuit 14 to the bond pad 20 and to de-couple the load circuit 12 from the bond pad 20. Of course, although the present invention is described with respect to the NMOS multiplexer 36, it will work equally well with a PMOS multiplexer. Also, it will be understood that the control voltage $V_{SELECT}$ may be generated on or off the IC die 10 (FIG. 1).

As shown in FIG. 3B, the programmable circuits 16 and 18 together comprise a CMOS multiplexer 44 having NMOS transistors 46 and 48 and PMOS transistors 50 and 52 that are selectable with a high control voltage $V_{SELECT}$ and control circuitry, such as an inverter 54, to couple the load circuit 12 to the bond pad 20 and to de-couple the load circuit 14 from the bond pad 20. The transistors 46, 48, 50, and 52 are also selectable with a low control voltage $V_{SELECT}$ and the inverter 54 to couple the load circuit 14 to the bond pad 20 and to de-couple the load circuit 12 from the bond pad 20. Of course, it will be understood that the control voltage $V_{SELECT}$ may be generated on or off the IC die 10 (FIG. 1).

Because the multiplexers 36 and 44 in FIGS. 3A and 3B couple the load circuits 12 and 14 to, and de-couple the load circuits 12 and 14 from, the bond pad 20 in response to the state of the control voltage $V_{SELECT}$, the multiplexers 36 and 44 advantageously allow the bond pad 20 to be switched back-and-forth between the load circuits 12 and 14 in response to the control voltage $V_{SELECT}$. This, in turn, allows the bond pad 20 to be switched back-and-forth between different configurations of the IC die 10 (FIG. 1) that may be associated with the load circuits 12 and 14.

Figure 4A:
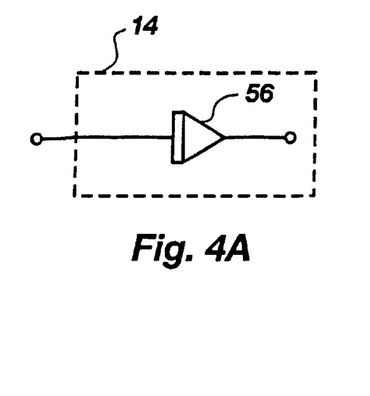
FIGS. 4A and 4B are schematics of alternative versions of a load circuit in the integrated circuit die of FIG. 1.
Figure 4B:
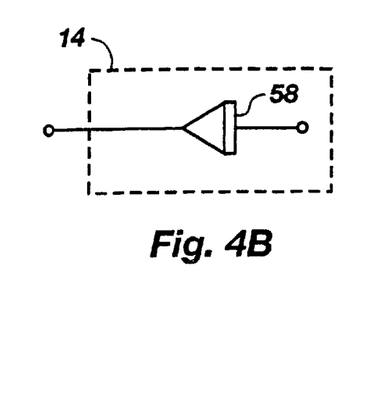

As shown in FIG. 4A, the load circuit 14 of FIG. 1 includes an input buffer 56. Also, as shown in FIG. 4B, the load circuit 14 of FIG. 1 includes an output buffer 58. Of course, it will be understood that FIGS. 4A and 4B are also representative of one version of the load circuit 12 of FIG. 1.

Figure 5:
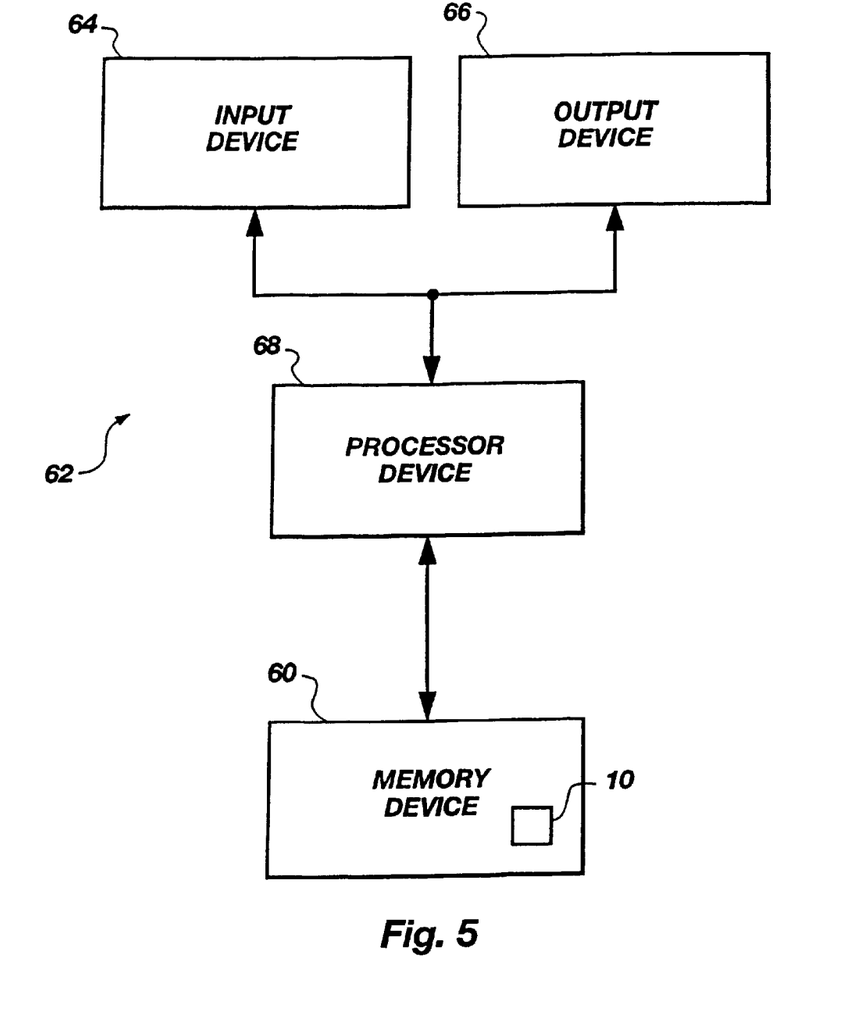
FIG. 5 is a block diagram of an electronic system incorporating the integrated circuit die of FIG. 1.

As shown in FIG. 5, the IC die 10 of FIG. 1 is incorporated into a memory device 60 in an electronic system 62, such as a computer system, that also includes an input device 64, an output device 66, and a processor device 68. Of course, although the IC die 10 is shown in FIG. 5 as being incorporated into the memory device 60, it will be understood that the IC die 10 may instead be incorporated into the input device 64, the output device 66, or the processor device 68.

Figure 6:
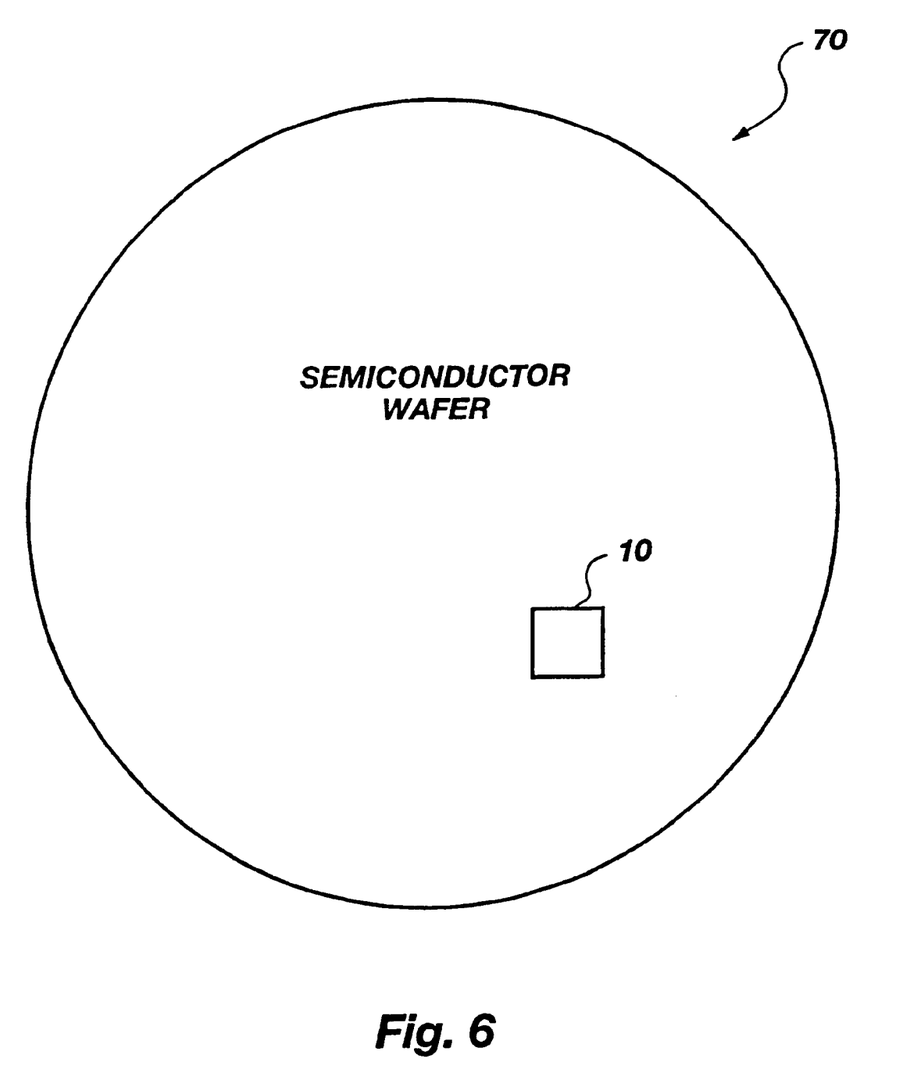
FIG. 6 is a diagram of a semiconductor wafer incorporating the integrated circuit die of FIG. 1.

As shown in FIG. 6, the IC die 10 of FIG. 1 has yet to be cut from a semiconductor wafer 70.

Although the present invention has been described with reference to a particular embodiment, the invention is not limited to this described embodiment. Rather, the invention is limited only by the appended claims, which include within their scope all equivalent devices or methods which operate according to the principles of the invention as described.

What is claimed is:

1. An apparatus for limiting signal skew in signals in a semiconductor die having at least two terminals, said semiconductor die having said at least two terminals for communicating with circuitry external to the die, each terminal of said at least two terminals being electrically loaded with at least one of a plurality of load circuits in the semiconductor die, and at least one of said at least two terminals being electrically loaded with more of the at least one of said plurality of load circuits than another of said at least two terminals, said apparatus comprising:

a plurality of programmable circuits, each of the plurality of programmable circuits coupled between the at least one terminal being electrically loaded with more of the at least one of said plurality of load circuits and a corresponding one of the at least one of said plurality of load circuits loading said at least one terminal, the plurality of programmable circuits for isolating said at least one terminal from at least some of the at least one of said plurality of load circuits loading said at least one terminal for reducing the electrical load in said at least one terminal to be substantially the same as the electrical load in remaining terminals of said at least two terminals.

2. The apparatus of claim 1, wherein at least one of the plurality of programmable circuits comprises a programmable element selected from a group comprising a metal fuse, a polysilicon fuse, and an anti-fuse.

3. The apparatus of claim 1, wherein said each of the plurality of programmable circuits comprises a substantially identical type of programmable element.

4. The apparatus of claim 1, wherein at least one of the plurality of programmable circuits comprises a programmable element interposed between said at least one terminal and said one of the at least one of said plurality of load circuits loading said at least one terminal.

5. The apparatus of claim 1, wherein at least one of the plurality of programmable circuits comprises a fuse of low resistivity interposed between said at least one terminal and said one of the at least one of said plurality of load circuits loading said at least one terminal.

6. The apparatus of claim 1, wherein at least one of the plurality of programmable circuits comprises a plurality of parallel, connected programmable elements, each element interposed between said at least one terminal and said one of the at least one of said plurality of load circuits loading said at least one terminal and each element of said plurality of parallel, connected programmable elements selected from a group comprising a fuse and an anti-fuse.

7. The apparatus of claim 1, wherein at least one of the plurality of programmable circuits comprises a switchable element for one of:
   selectively isolating said at least one terminal from said one of the at least one of said plurality of load circuits loading said at least one terminal; and
   selectively coupling said at least one terminal to said one of the at least one of said plurality of load circuits loading said at least one terminal.

8. The apparatus of claim 7, wherein each switchable element is interposed between said at least one terminal and said one of the at least one of said plurality of load circuits loading said at least one terminal.

9. The apparatus of claim 7, wherein each switchable element comprises a MOS transistor.

10. The apparatus of claim 1, wherein at least one of the plurality of programmable circuits comprises a plurality of parallel, connected switchable elements for one of:
    selectively isolating said at least one terminal from said one of the at least one of said plurality of load circuits loading said at least one terminal; and
    selectively coupling said at least one terminal to said one of the at least one of said plurality of load circuits loading said at least one terminal.

11. The apparatus of claim 1, wherein at least two of the plurality of programmable circuits comprise a multiplexer.

12. The apparatus of claim 11, wherein the multiplexer is selected from a group comprising an NMOS multiplexer and a CMOS multiplexer.

13. An integrated circuit die comprising:
    a plurality of terminals for communicating with circuitry external to the integrated circuit die;
    a plurality of load circuits for electrically loading the plurality of terminals for having at least one terminal of the plurality of terminals loaded with more load circuits of the plurality of load circuits than the other terminals of the plurality of terminals; and
    a plurality of programmable circuits, each programmable circuit coupled between the at least one terminal loaded with more load circuits of the plurality of load circuits and a corresponding one of the plurality of load circuits capable of loading said at least one terminal, the plurality of programmable circuits for isolating said at least one terminal from at least one other load circuit of the plurality of load circuits for loading said at least one terminal for reducing the electrical load in said at least one terminal to be substantially the same as the electrical load in the remaining terminals of the plurality of terminals.

14. The integrated circuit die of claim 13, wherein said at least one terminal comprises an integrated circuit die bond pad.

15. The integrated circuit die of claim 13, wherein at least one of the plurality of load circuits is selected from a group comprising an input buffer and an output driver.

16. The integrated circuit die of claim 13, wherein at least one of the plurality of programmable circuits comprises a fuse of low resistivity interposed between said at least one terminal and said one of the plurality of load circuits.

17. The integrated circuit die of claim 13, wherein at least one of the plurality of programmable circuits comprises a plurality of parallel, connected programmable elements, each parallel, connected programmable element interposed between said at least one terminal and said one of the plurality of load circuits and each parallel, connected programmable element selected from a group comprising a fuse and an anti-fuse.

18. An integrated circuit die comprising:
    a plurality of terminals for communicating with circuitry external to the integrated circuit die;
    a plurality of load circuits for electrically loading the plurality of terminals for having at least one terminal of the plurality of terminals loaded with more of the plurality of load circuits than at least one remaining terminal of said plurality of terminals; and
    a plurality of programmable circuits, each programmable circuit coupled between said at least one terminal loaded with more of the plurality of load circuits and a corresponding one of the plurality of load circuits capable of loading said at least one terminal, the plurality of programmable circuits for isolating said at least one terminal from at least one load circuit of the plurality of load circuits for loading said at least one terminal for reducing the electrical load in said at least one terminal to be substantially the same as the electrical load in at least one of the remaining terminals.

19. A semiconductor wafer comprising at least one semiconductor die thereon, said at least one semiconductor die having at least one circuit, comprising:
    a plurality of terminals for communication with circuitry external to the at least one semiconductor die;
    a plurality of load circuits for electrically loading the plurality of terminals such that at least one terminal of the plurality of terminals is loaded with more load circuits of the plurality of load circuits than at least one other terminal of the plurality of terminals; and
    a plurality of programmable circuits, each programmable circuit coupled between the at least one terminal of the plurality of terminals for loading with more of the load circuits of the plurality of load circuits and a corresponding one of the plurality of load circuits constructed to load said at least one terminal, the plurality of programmable circuits for isolating said at least one terminal from at least one other load circuit of the plurality of load circuits constructed for loading said at least one terminal for reducing the electrical load in said at least one terminal to be substantially the same as the electrical load in the remaining terminals of the plurality of terminals.

20. The semiconductor wafer of claim 19, wherein at least one of the plurality of programmable circuits comprises a fuse of low resistivity interposed between said at least one terminal and said one of the plurality of load circuits.

21. The semiconductor wafer of claim 19, wherein at least one of the plurality of programmable circuits comprises a plurality of parallel, connected programmable elements, each parallel, connected programmable element interposed between said at least one terminal and said one of the load circuits of the plurality of load circuits and each parallel, connected programmable element selected from a group comprising a fuse and an anti-fuse.

22. An electronic system comprising an input device, an output device, a memory device, and a processor device coupled to the input, output, and memory devices, at least one of the input, output, memory, and processor devices comprising a semiconductor die having at least one circuit therein comprising:
    a plurality of terminals for communicating with circuitry external to the semiconductor die, the plurality of terminals including a first terminal;

a plurality of load circuits for electrically loading the plurality of terminals, including the first terminal; and a plurality of programmable circuits, each programmable circuit coupled between the first terminal and a corresponding one of the plurality of load circuits for loading the first terminal, the plurality of programmable circuits for isolating the first terminal from at least some of the plurality of load circuits constructed to load the first terminal for reducing the electrical load in said first terminal to be substantially the same as the electrical load in the remaining terminals of the plurality of terminals.

23. The electronic system of claim 22, wherein at least one of the plurality of programmable circuits comprises a fuse of low resistivity interposed between said first terminal and said one of the plurality of load circuits.

24. The electronic system of claim 22, wherein at least one of the plurality of programmable circuits comprises a plurality of parallel, connected programmable elements, each parallel, connected programmable element interposed between said first terminal and said one of the plurality of load circuits and each parallel, connected programmable element selected from a group comprising a fuse and an anti-fuse.

25. A semiconductor die comprising:

a plurality of bond pads;

a plurality of first load circuits for communicating through the plurality of bond pads in a first operating mode of the semiconductor die having each first load circuit of the plurality electrically loading its respective bond pad with substantially the same electrical load;

a second load circuit for communicating through one of the plurality of bond pads in a second operating mode of the semiconductor die having the second load circuit electrically loading its respective bond pad with an additional electrical load such that its respective bond pad has more of an electrical load than remaining bond pads;

a first fuse interposed between the respective bond pad associated with the second load circuit and the first load circuit associated with said respective bond pad for coupling said respective bond pad to said first load circuit in the first operating mode and for isolating said respective bond pad from said first load circuit in the second operating mode; and a second fuse interposed between said respective bond pad and the second load circuit for coupling said respective bond pad to the second load circuit in the second operating mode and for isolating said respective bond pad from the second load circuit in the first operating mode for reducing the electrical load on said respective bond pad to be substantially the same as the electrical load in the remaining bond pads.

26. The integrated circuit die of claim 25, wherein at least one of the first and second fuses comprises a fuse of low resistivity.

27. A method for limiting signal skew in signals propagating through a semiconductor die having a plurality of terminals for communicating with circuitry external to the semiconductor die, each terminal of the plurality of terminals for electrical loading with at least one of a plurality of load circuits in the semiconductor die, and at least one of the plurality of terminals for electrical loading with more of the plurality of load circuits than remaining terminals of the plurality of terminals, said method for limiting signal skew comprising:

providing a plurality of programmable circuits on the semiconductor die, each programmable circuit coupled between the at least one terminal loaded with more of the plurality of load circuits and a corresponding one of the plurality of load circuits loading said at least one terminal; and configuring the plurality of programmable circuits for isolating the at least one terminal loaded with more of the plurality of load circuits from some of the plurality of load circuits loading said at least one terminal for reducing the electrical load in the at least one terminal to be substantially the same as the electrical load in the remaining terminals of the plurality of terminals.

28. The method of claim 27, wherein the providing the plurality of programmable circuits comprises:

providing at least one programmable element; and interposing the at least one programmable element between said at least one terminal and said one of the plurality of load circuits.

29. The method of claim 28, wherein the interposing the at least one programmable element between said at least one terminal and said one of the plurality of load circuits comprises interposing a fuse of low resistance between said at least one terminal and said one of the plurality of load circuits.

30. The method of claim 28, wherein the interposing the at least one programmable element between said at least one terminal and said one of the plurality of load circuits comprises interposing a plurality of parallel, connected programmable elements between said at least one terminal and said one of the plurality of load circuits, said at least one programmable element being selected from a group comprising a fuse and an anti-fuse.

31. The method of claim 27, wherein providing the plurality of programmable circuits comprises providing at least one of the programmable circuits from a group comprising a metal fuse, a polysilicon fuse, and an anti-fuse.

* * * * *

UNITED STATES PATENT AND TRADEMARK OFFICE
CERTIFICATE OF CORRECTION

PATENT NO. : 6,417,721 B2
APPLICATION NO. : 09/878576
DATED : July 9, 2002
INVENTOR(S) : Joseph C. Sher It is certified that error appears in the above-identified patent and that said Letters Patent is hereby corrected as shown below:

On the title page:
In ITEM (63) "Related U.S. Application Data," LINE 2, after "19, 1998," insert --now Pat. No. 6,285,237,--

COLUMN 1, LINE 10, after "1998," change "pending," to --now U.S. Pat. No. 6,285,237, issued Sep. 4, 2001,--

COLUMN 3, LINE 62, change "18 configurable" to --18 are configurable--

Signed and Sealed this

Eighth Day of May, 2007

JON W. DUDAS
*Director of the United States Patent and Trademark Office*